United States Patent
Lung

(10) Patent No.: US 7,972,895 B2
(45) Date of Patent: Jul. 5, 2011

(54) MEMORY CELL DEVICE WITH COPLANAR ELECTRODE SURFACE AND METHOD

(75) Inventor: Hsiang-Lan Lung, Elmsford, NY (US)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 12/576,819

(22) Filed: Oct. 9, 2009

(65) Prior Publication Data

US 2010/0029042 A1  Feb. 4, 2010

Related U.S. Application Data

(62) Division of application No. 12/023,978, filed on Jan. 31, 2008, now Pat. No. 7,619,311.

(51) Int. Cl.
*H01L 21/06* (2006.01)
(52) U.S. Cl. .......................................... 438/102; 438/95
(58) Field of Classification Search .................. 257/614, 257/441–442, 313–317, 330–331, 214, 298, 257/E45.001–E45.004; 438/95, 102
See application file for complete search history.

(56) References Cited

U.S. PATENT DOCUMENTS

| | | | |
|---|---|---|---|
| 3,271,591 A | 9/1966 | Ovshinsky | |
| 3,530,441 A | 9/1970 | Ovshinsky | |
| 4,452,592 A | 6/1984 | Tsai | |
| 4,599,705 A | 7/1986 | Holmberg et al. | |
| 4,719,594 A | 1/1988 | Young et al. | |
| 4,769,339 A | 9/1988 | Ishii et al. | |
| 4,876,220 A | 10/1989 | Mohsen et al. | |
| 4,959,812 A | 9/1990 | Momodomi et al. | |
| 5,106,775 A | 4/1992 | Kaga et al. | |
| 5,166,096 A | 11/1992 | Cote et al. | |
| 5,166,758 A | 11/1992 | Ovshinsky et al. | |
| 5,177,567 A | 1/1993 | Klersy et al. | |
| 5,332,923 A | 7/1994 | Takeuchi et al. | |
| 5,389,566 A * | 2/1995 | Lage | 438/3 |
| 5,391,901 A | 2/1995 | Tanabe et al. | |
| 5,515,488 A | 5/1996 | Hoppe et al. | |

(Continued)

FOREIGN PATENT DOCUMENTS

CN     1462478 A     12/2003

(Continued)

OTHER PUBLICATIONS

"Magnetic Bit Boost," www.sciencenews.org, Dec. 18 & 25, 2004, p. 389, vol. 166.

(Continued)

*Primary Examiner* — Marcos D Pizarro
*Assistant Examiner* — Sue Tang
(74) *Attorney, Agent, or Firm* — Haynes Beffel & Wolfeld LLP

(57) ABSTRACT

A memory device described herein includes a bit line having a top surface and a plurality of vias. The device includes a plurality of first electrodes each having top surfaces coplanar with the top surface of the bit line, the first electrodes extending through corresponding vias in the bit line. An insulating member is within each via and has an annular shape with a thickness between the corresponding first electrode and a portion of the bit line acting as a second electrode. A layer of memory material extends across the insulating members to contact the top surfaces of the bit line and the first electrodes.

8 Claims, 12 Drawing Sheets

U.S. PATENT DOCUMENTS

| | | |
|---|---|---|
| 5,534,712 A | 7/1996 | Ovshinsky et al. |
| 5,550,396 A | 8/1996 | Tsutsumi et al. |
| 5,687,112 A | 11/1997 | Ovshinsky |
| 5,688,713 A | 11/1997 | Linliu et al. |
| 5,716,883 A | 2/1998 | Tseng et al. |
| 5,789,277 A | 8/1998 | Zahorik et al. |
| 5,789,758 A | 8/1998 | Reinberg |
| 5,814,527 A | 9/1998 | Wolstenholme et al. |
| 5,831,276 A | 11/1998 | Gonzalez et al. |
| 5,837,564 A | 11/1998 | Sandhu et al. |
| 5,869,843 A | 2/1999 | Harshfield |
| 5,879,955 A | 3/1999 | Gonzalez et al. |
| 5,902,704 A | 5/1999 | Schoenborn et al. |
| 5,920,788 A | 7/1999 | Reinberg |
| 5,933,365 A | 8/1999 | Klersy et al. |
| 5,952,671 A | 9/1999 | Reinberg et al. |
| 5,958,358 A | 9/1999 | Tenne et al. |
| 5,970,336 A | 10/1999 | Wolstenholme et al. |
| 5,985,698 A | 11/1999 | Gonzalez et al. |
| 5,998,244 A | 12/1999 | Wolstenholme et al. |
| 6,011,725 A | 1/2000 | Eitan |
| 6,025,220 A | 2/2000 | Sandhu |
| 6,031,287 A | 2/2000 | Harshfield |
| 6,034,882 A | 3/2000 | Johnson et al. |
| 6,066,870 A | 5/2000 | Siek |
| 6,077,674 A | 6/2000 | Schleifer et al. |
| 6,077,729 A | 6/2000 | Harshfield |
| 6,087,269 A | 7/2000 | Williams |
| 6,087,674 A | 7/2000 | Ovshinsky et al. |
| 6,104,038 A | 8/2000 | Gonzalez et al. |
| 6,111,264 A | 8/2000 | Wolstenholme et al. |
| 6,114,713 A | 9/2000 | Zahorik |
| 6,117,720 A | 9/2000 | Harshfield |
| 6,147,395 A | 11/2000 | Gilgen |
| 6,150,253 A | 11/2000 | Doan et al. |
| 6,153,890 A | 11/2000 | Wolstenholme et al. |
| 6,177,317 B1 | 1/2001 | Huang et al. |
| 6,185,122 B1 | 2/2001 | Johnson et al. |
| 6,189,582 B1 | 2/2001 | Reinberg et al. |
| 6,236,059 B1 | 5/2001 | Wolstenholme et al. |
| RE37,259 E | 7/2001 | Ovshinsky |
| 6,271,090 B1 | 8/2001 | Huang et al. |
| 6,280,684 B1 | 8/2001 | Yamada et al. |
| 6,287,887 B1 | 9/2001 | Gilgen |
| 6,291,137 B1 | 9/2001 | Lyons et al. |
| 6,314,014 B1 | 11/2001 | Lowrey et al. |
| 6,316,348 B1 | 11/2001 | Fu et al. |
| 6,320,786 B1 | 11/2001 | Chang et al. |
| 6,326,307 B1 | 12/2001 | Lindley et al. |
| 6,339,544 B1 | 1/2002 | Chiang et al. |
| 6,351,406 B1 | 2/2002 | Johnson et al. |
| 6,372,651 B1 | 4/2002 | Yang et al. |
| 6,380,068 B2 | 4/2002 | Jeng et al. |
| 6,420,215 B1 | 7/2002 | Knall et al. |
| 6,420,216 B1 | 7/2002 | Clevenger et al. |
| 6,420,725 B1 | 7/2002 | Harshfield |
| 6,423,621 B2 | 7/2002 | Doan et al. |
| 6,429,064 B1 | 8/2002 | Wicker |
| 6,440,837 B1 | 8/2002 | Harshfield |
| 6,462,353 B1 | 10/2002 | Gilgen |
| 6,483,736 B2 | 11/2002 | Johnson et al. |
| 6,487,114 B2 | 11/2002 | Jong et al. |
| 6,501,111 B1 | 12/2002 | Lowrey |
| 6,511,867 B2 | 1/2003 | Lowrey et al. |
| 6,512,241 B1 | 1/2003 | Lai |
| 6,514,788 B2 | 2/2003 | Quinn |
| 6,514,820 B2 | 2/2003 | Ahn et al. |
| 6,534,781 B2 | 3/2003 | Dennison |
| 6,545,903 B1 | 4/2003 | Wu |
| 6,551,866 B1 | 4/2003 | Maeda et al. |
| 6,555,860 B2 | 4/2003 | Lowrey et al. |
| 6,563,156 B2 | 5/2003 | Harshfield |
| 6,566,700 B2 | 5/2003 | Xu |
| 6,567,293 B1 | 5/2003 | Lowrey et al. |
| 6,576,546 B2 | 6/2003 | Gilbert et al. |
| 6,579,760 B1 | 6/2003 | Lung |
| 6,586,761 B2 | 7/2003 | Lowrey |
| 6,589,714 B2 | 7/2003 | Maimon et al. |
| 6,593,176 B2 | 7/2003 | Dennison |
| 6,596,589 B2 | 7/2003 | Tseng et al. |
| 6,597,009 B2 | 7/2003 | Wicker |
| 6,605,527 B2 | 8/2003 | Dennison et al. |
| 6,605,821 B1 | 8/2003 | Lee et al. |
| 6,607,974 B2 | 8/2003 | Harshfield |
| 6,613,604 B2 | 9/2003 | Maimon et al. |
| 6,617,192 B1 | 9/2003 | Lowrey et al. |
| 6,621,095 B2 | 9/2003 | Chiang et al. |
| 6,627,530 B2 | 9/2003 | Li et al. |
| 6,639,849 B2 | 10/2003 | Takahashi et al. |
| 6,673,700 B2 | 1/2004 | Dennison et al. |
| 6,674,115 B2 | 1/2004 | Hudgens et al. |
| 6,744,088 B1 | 6/2004 | Dennison |
| 6,750,079 B2 | 6/2004 | Lowrey et al. |
| 6,750,101 B2 | 6/2004 | Lung et al. |
| 6,791,102 B2 | 9/2004 | Johnson et al. |
| 6,797,979 B2 | 9/2004 | Chiang et al. |
| 6,800,563 B2 | 10/2004 | Xu |
| 6,815,704 B1 | 11/2004 | Chen |
| 6,838,692 B1 | 1/2005 | Lung et al. |
| 6,850,432 B2 | 2/2005 | Lu et al. |
| 6,859,389 B2 | 2/2005 | Idehara |
| 6,861,267 B2 | 3/2005 | Xu et al. |
| 6,864,500 B2 | 3/2005 | Gilton |
| 6,864,503 B2 | 3/2005 | Lung |
| 6,867,638 B2 | 3/2005 | Saiki et al. |
| 6,888,750 B2 | 5/2005 | Walker et al. |
| 6,894,304 B2 | 5/2005 | Moore |
| 6,894,305 B2 | 5/2005 | Yi et al. |
| 6,897,467 B2 | 5/2005 | Doan et al. |
| 6,900,517 B2 | 5/2005 | Tanaka et al. |
| 6,903,362 B2 | 6/2005 | Wyeth et al. |
| 6,909,107 B2 | 6/2005 | Rodgers et al. |
| 6,910,907 B2 | 6/2005 | Layadi et al. |
| 6,927,410 B2 | 8/2005 | Chen |
| 6,928,022 B2 | 8/2005 | Cho et al. |
| 6,933,516 B2 | 8/2005 | Xu |
| 6,936,544 B2 | 8/2005 | Huang et al. |
| 6,936,840 B2 | 8/2005 | Sun et al. |
| 6,937,507 B2 | 8/2005 | Chen |
| 6,943,365 B2 | 9/2005 | Lowrey et al. |
| 6,969,866 B1 | 11/2005 | Lowrey et al. |
| 6,972,428 B2 | 12/2005 | Maimon |
| 6,972,430 B2 | 12/2005 | Casagrande et al. |
| 6,977,181 B1 | 12/2005 | Raberg et al. |
| 6,992,932 B2 | 1/2006 | Cohen |
| 7,023,009 B2 | 4/2006 | Kostylev et al. |
| 7,033,856 B2 | 4/2006 | Lung et al. |
| 7,038,230 B2 | 5/2006 | Chen et al. |
| 7,038,938 B2 | 5/2006 | Kang et al. |
| 7,042,001 B2 | 5/2006 | Kim et al. |
| 7,067,864 B2 | 6/2006 | Nishida et al. |
| 7,067,865 B2 | 6/2006 | Lung et al. |
| 7,078,273 B2 | 7/2006 | Matsuoka et al. |
| 7,115,927 B2 | 10/2006 | Hideki et al. |
| 7,122,281 B2 | 10/2006 | Pierrat |
| 7,122,824 B2 | 10/2006 | Khouri et al. |
| 7,126,149 B2 | 10/2006 | Iwasaki et al. |
| 7,132,675 B2 | 11/2006 | Gilton |
| 7,154,774 B2 | 12/2006 | Bedeschi et al. |
| 7,164,147 B2 | 1/2007 | Lee et al. |
| 7,166,533 B2 | 1/2007 | Happ |
| 7,169,635 B2 | 1/2007 | Kozicki |
| 7,202,493 B2 | 4/2007 | Lung et al. |
| 7,208,751 B2 | 4/2007 | Ooishi et al. |
| 7,214,958 B2 | 5/2007 | Happ |
| 7,220,983 B2 | 5/2007 | Lung |
| 7,238,994 B2 | 7/2007 | Chen et al. |
| 7,248,494 B2 | 7/2007 | Oh et al. |
| 7,251,157 B2 | 7/2007 | Osada et al. |
| 7,269,052 B2 | 9/2007 | Segal et al. |
| 7,277,317 B2 | 10/2007 | Le Phan et al. |
| 7,291,556 B2 | 11/2007 | Choi et al. |
| 7,309,630 B2 | 12/2007 | Fan et al. |
| 7,321,130 B2 | 1/2008 | Lung et al. |
| 7,323,708 B2 | 1/2008 | Lee et al. |
| 7,332,370 B2 | 2/2008 | Chang et al. |
| 7,336,526 B2 | 2/2008 | Osada et al. |

| | | |
|---|---|---|
| 7,351,648 B2 | 4/2008 | Furukawa et al. |
| 7,359,231 B2 | 4/2008 | Venkataraman et al. |
| 7,364,935 B2 | 4/2008 | Lung et al. |
| 7,365,385 B2 | 4/2008 | Abbott |
| 7,379,328 B2 | 5/2008 | Osada et al. |
| 7,385,235 B2 | 6/2008 | Lung et al. |
| 7,394,088 B2 | 7/2008 | Lung |
| 7,397,060 B2 | 7/2008 | Lung |
| 7,423,300 B2 | 9/2008 | Lung et al. |
| 7,426,134 B2 | 9/2008 | Happ et al. |
| 7,485,891 B2 | 2/2009 | Hamann et al. |
| 7,560,337 B2 | 7/2009 | Ho et al. |
| 2002/0070457 A1 | 6/2002 | Sun et al. |
| 2002/0113273 A1 | 8/2002 | Hwang et al. |
| 2003/0095426 A1 | 5/2003 | Hush et al. |
| 2003/0186481 A1 | 10/2003 | Lung |
| 2004/0026686 A1 | 2/2004 | Lung |
| 2004/0051094 A1 | 3/2004 | Ooishi |
| 2004/0165422 A1 | 8/2004 | Hideki et al. |
| 2004/0248339 A1 | 12/2004 | Lung |
| 2004/0256610 A1 | 12/2004 | Lung |
| 2005/0018526 A1 | 1/2005 | Lee |
| 2005/0029502 A1 | 2/2005 | Hudgens |
| 2005/0062087 A1 | 3/2005 | Chen et al. |
| 2005/0093022 A1 | 5/2005 | Lung |
| 2005/0127347 A1 | 6/2005 | Choi et al. |
| 2005/0145984 A1 | 7/2005 | Chen et al. |
| 2005/0191804 A1 | 9/2005 | Lai et al. |
| 2005/0201182 A1 | 9/2005 | Osada et al. |
| 2005/0212024 A1 | 9/2005 | Happ |
| 2005/0215009 A1 | 9/2005 | Cho |
| 2006/0001174 A1* | 1/2006 | Matsui ................. 257/774 |
| 2006/0006472 A1 | 1/2006 | Jiang |
| 2006/0038221 A1 | 2/2006 | Lee et al. |
| 2006/0066156 A1 | 3/2006 | Dong et al. |
| 2006/0073642 A1 | 4/2006 | Yeh et al. |
| 2006/0091476 A1 | 5/2006 | Pinnow et al. |
| 2006/0094154 A1 | 5/2006 | Lung |
| 2006/0108667 A1 | 5/2006 | Lung |
| 2006/0110878 A1 | 5/2006 | Lung et al. |
| 2006/0110888 A1 | 5/2006 | Cho et al. |
| 2006/0113521 A1 | 6/2006 | Lung |
| 2006/0113587 A1* | 6/2006 | Thies et al. ............ 257/328 |
| 2006/0118913 A1 | 6/2006 | Yi et al. |
| 2006/0124916 A1 | 6/2006 | Lung |
| 2006/0126395 A1 | 6/2006 | Chen et al. |
| 2006/0131555 A1 | 6/2006 | Liu et al. |
| 2006/0138467 A1 | 6/2006 | Lung |
| 2006/0154185 A1 | 7/2006 | Ho et al. |
| 2006/0157680 A1 | 7/2006 | Takaura et al. |
| 2006/0157681 A1 | 7/2006 | Chen et al. |
| 2006/0226409 A1 | 10/2006 | Burr et al. |
| 2006/0234138 A1 | 10/2006 | Fehlhaber et al. |
| 2006/0284157 A1 | 12/2006 | Chen et al. |
| 2006/0284158 A1 | 12/2006 | Lung et al. |
| 2006/0284214 A1 | 12/2006 | Chen |
| 2006/0284279 A1 | 12/2006 | Lung et al. |
| 2006/0286709 A1 | 12/2006 | Lung et al. |
| 2006/0286743 A1 | 12/2006 | Lung et al. |
| 2006/0289848 A1 | 12/2006 | Dennison |
| 2007/0008786 A1 | 1/2007 | Scheuerlein |
| 2007/0030721 A1 | 2/2007 | Segal et al. |
| 2007/0037101 A1 | 2/2007 | Morioka |
| 2007/0045606 A1 | 3/2007 | Magistretti et al. |
| 2007/0051936 A1 | 3/2007 | Pellizzer et al. |
| 2007/0096162 A1 | 5/2007 | Happ et al. |
| 2007/0108077 A1 | 5/2007 | Lung et al. |
| 2007/0108429 A1 | 5/2007 | Lung |
| 2007/0108430 A1 | 5/2007 | Lung |
| 2007/0108431 A1 | 5/2007 | Chen et al. |
| 2007/0109836 A1 | 5/2007 | Lung |
| 2007/0109843 A1 | 5/2007 | Lung et al. |
| 2007/0111429 A1 | 5/2007 | Lung |
| 2007/0115794 A1 | 5/2007 | Lung |
| 2007/0117315 A1 | 5/2007 | Lai et al. |
| 2007/0121363 A1 | 5/2007 | Lung |
| 2007/0121374 A1 | 5/2007 | Lung et al. |
| 2007/0126040 A1 | 6/2007 | Lung |
| 2007/0131922 A1 | 6/2007 | Lung |
| 2007/0131980 A1 | 6/2007 | Lung |
| 2007/0138458 A1 | 6/2007 | Lung |
| 2007/0153563 A1 | 7/2007 | Nirschl |
| 2007/0154847 A1 | 7/2007 | Chen et al. |
| 2007/0155172 A1 | 7/2007 | Lai et al. |
| 2007/0158632 A1 | 7/2007 | Ho |
| 2007/0158633 A1 | 7/2007 | Lai et al. |
| 2007/0158645 A1 | 7/2007 | Lung |
| 2007/0158690 A1 | 7/2007 | Ho et al. |
| 2007/0158862 A1 | 7/2007 | Lung |
| 2007/0161186 A1 | 7/2007 | Ho |
| 2007/0173019 A1 | 7/2007 | Ho et al. |
| 2007/0173063 A1 | 7/2007 | Lung |
| 2007/0176261 A1 | 8/2007 | Lung |
| 2007/0187664 A1 | 8/2007 | Happ |
| 2007/0201267 A1 | 8/2007 | Happ et al. |
| 2007/0215852 A1 | 9/2007 | Lung |
| 2007/0224726 A1 | 9/2007 | Chen et al. |
| 2007/0235811 A1 | 10/2007 | Furukawa et al. |
| 2007/0236989 A1 | 10/2007 | Lung |
| 2007/0246699 A1 | 10/2007 | Lung |
| 2007/0249090 A1 | 10/2007 | Philipp et al. |
| 2007/0252127 A1* | 11/2007 | Arnold et al. .............. 257/2 |
| 2007/0257300 A1 | 11/2007 | Ho et al. |
| 2007/0262388 A1 | 11/2007 | Ho et al. |
| 2007/0274121 A1 | 11/2007 | Lung et al. |
| 2007/0285960 A1 | 12/2007 | Lung et al. |
| 2007/0298535 A1 | 12/2007 | Lung |
| 2008/0006811 A1 | 1/2008 | Philipp et al. |
| 2008/0012000 A1 | 1/2008 | Harshfield |
| 2008/0014676 A1 | 1/2008 | Lung et al. |
| 2008/0025089 A1 | 1/2008 | Scheuerlein et al. |
| 2008/0043520 A1 | 2/2008 | Chen |
| 2008/0094871 A1 | 4/2008 | Parkinson |
| 2008/0101110 A1 | 5/2008 | Happ et al. |
| 2008/0137400 A1 | 6/2008 | Chen et al. |
| 2008/0164453 A1 | 7/2008 | Breitwisch et al. |
| 2008/0165569 A1 | 7/2008 | Chen et al. |
| 2008/0165570 A1 | 7/2008 | Happ et al. |
| 2008/0165572 A1 | 7/2008 | Lung |
| 2008/0166875 A1 | 7/2008 | Lung |
| 2008/0179582 A1 | 7/2008 | Burr et al. |
| 2008/0180990 A1 | 7/2008 | Lung |
| 2008/0186755 A1 | 8/2008 | Lung et al. |
| 2008/0191187 A1 | 8/2008 | Lung et al. |
| 2008/0192534 A1 | 8/2008 | Lung |
| 2008/0224119 A1 | 9/2008 | Burr et al. |
| 2008/0225489 A1 | 9/2008 | Cai et al. |
| 2008/0303014 A1 | 12/2008 | Goux et al. |

FOREIGN PATENT DOCUMENTS

| | | |
|---|---|---|
| WO | WO-0079539 A1 | 12/2000 |
| WO | WO-0145108 A1 | 6/2001 |

OTHER PUBLICATIONS

"New Memories Tap Spin, Gird for Battle," Science News, Apr. 3, 1999, p. 223, vol. 155.

"Optimized Thermal Capacitance in a Phase Change Memory Cell Design," IPCOM000141986D, IP.com Prior Art Database, Oct. 18, 2006, 4pp.

"Remembering on the Cheap," www.sciencenews.org, Mar. 19, 2005, p. 189, vol. 167.

"Thermal Conductivity of Crystalline Dielectrics" in CRC Handbook of Chemistry and Physics, Internet Version 2007, (87th edition), David R. Lide, ed. Taylor and Francis, Boca Raton, Fl, 2pp.

Adler, D. et al., "Threshold Switching in Chalcogenide-Glass Thin Films," J. Appl/Phys 51(6), Jun. 1980, pp. 3289-3309.

Adler, David, "Amorphous-Semiconductor Devices," Sci. Amer., vol. 236, pp. 36-48, May 1977.

Ahn, S. J. et al., "A Highly Manufacturable High Density Phase Change Memory of 64 Mb and Beyond," IEEE IEDM 2004, pp. 907-910.

Ahn, S. J. et al., "Highly Reliable 5nm Contact Cell Technology for 256Mb PRAM," VLSI Technology, Digest of Technical Papers, Jun. 14-16, 2005, pp. 98-99.

Atwood, G, et al., "90 nm Phase Change Technology with u Trench and Lance Cell Elements," VLSI Technology, Systems and Applications, Apr. 23-25, 2007, pp. 1-2.

Axon Technologies Corporation paper: Technology Description, published in 1997, pp. 1-6.

Bedeschi, F. et al., "4-MB MOSFET-Selected Phase-Change Memory Experimental Chip," IEEE, 2004, 4 PP.

Blake thesis, "Investigation of GeTeSb5 Chalcogenide Films for Use as an Analog Memory," AFIT/GE/ENG/00M-04, Mar. 2000, 121 pages.

Chao, Der-Sheng, et al., "Low Programming Current Phase Change Memory Cell with Double GST Thermally Confined Structure," Int'l Symp on VLSI Technology, Systems and Applications, Apr. 23-25, 2007, pp. 1-2.

Chen, An et al., "Non-Volatile Resistive Switching for Advanced Memory Applications," IEEE IEDM, Dec. 5-7, 2005, 4 pp.

Cho, S. L. et al., "Highly Scalable On-axis Confined Cell Structure for High Density PRAM beyond 256Mb," 2005 Symposium on VLSI Technology Digest of Technical Papers, pp. 96-97.

Gibson, G. A. et al., "Phase-change Recording Medium that Enables Ultrahigh-density Electron-beam Data Storage," Applied Physics Letter, 2005, 3 pp., vol. 86.

Gill, Manzur et al., "A High-Performance Nonvolatile Memory Technology for Stand-Alone Memory and Embedded Applications," 2002 IEEE-ISSCC Technical Digest (TD 12.4), 7 pp.

Ha, Y. H. et al., "An Edge Contact Type Cell for Phase Change RAM Featuring Very Low Power Consumption," 2003 Symposium on VLSI Technology Digest of Technical Papers, pp. 175-176.

Happ, T. D. et al., "Novel None-Mask Self-Heating Pillar Phase Change Memory," 2006 Symposium on VLSI Technology, 2 pp.

Haring Bolivar, P. et al., "Lateral Design for Phase Change Random Access Memory Cells with Low-Current Consumption," presented at 3rd E*PCOS 04 Symposium in Balzers, Principality of Liechtenstein, Sep. 4-7, 2004, 4pp.

Horii, H. et al., "A Novel Cell Technology Using N-doped GeSbTe Films for Phase Change RAM," 2003 Symposium on VLSI Technology Digest of Technical Papers, pp. 177-178.

Hudgens, S. et al., "Overview of Phase-Change Chalcogenide Nonvolatile Memory Technology," MRS Bulletin, Nov. 2004, pp. 829-832.

Hwang, Y. N. et al., "Full Integration and Reliability Evaluation of Phase-change RAM Based on 0.24um-CMOS Technologies," 2003 Symposium on VLSI Technology Digest of Technical Papers, pp. 173-174.

Iwasaki, Hiroko et al., "Completely Erasable Phase Change Optical Disk," Jpn. J. Appl. Phys., Feb. 1992, pp. 461-465, vol. 31.

Jeong, C. W. et al., "Switching Current Scaling and Reliability Evaluation in PRAM," IEEE Non-Volatile Semiconductor Memory Workshop, Monterey, CA 2004, pp. 28-29 and workshop cover sheet.

Kim, Kinam et al., "Reliability Investigations for Manufacturable High Density PRAM," IEEE 43rd Annual International Reliability Physics Symposium, San Jose, 2005, pp. 157-162.

Kojima, Rie et al., "Ge-Sn-Sb-Te Phase-change Recording Material Having High Crystallization Speed," Proceedings of PCOS 2000, pp. 36-41.

Lacita, A. L., "Electrothermal and Phase-change Dynamics in Chalcogenide-based Memories," IEEE IEDM 2004, 4 pp.

Lai, Stefan, "Current Status of the Phase Change Memory and Its Future," IEEE IEDM 2003, pp. 255-258.

Lai, Stephan et al., "OUM-A 180 nm Nonvolatile Memory Cell Element Technology for Stand Alone and Embedded Applications," IEEE IEDM 2001, pp. 803-806.

Lankhorst, Martijn H.R., et al; Low-Cost and Nanoscale Non-Volatile Memory Concept for Future Silicon Chips, Mar. 13, 2005, 6 pp., Nature Materials Advance Online Publication, www.nature.com/naturematerials.

Mott, Nevill, "Electrons in Glass," Nobel Lecture, Dec. 8, 1977, Physics, 1977, pp. 403-413.

Ovonyx Non-Confidential paper entitled "Ovonic Unified Memory," Dec. 1999, pp. 1-80.

Ovshinsky, Sandford R., "Reversible Electrical Switching Phenomena in Disordered Structures," Physical Review Letters, vol. 21, No. 20, Nov. 11, 1968, pp. 1450-1453.

Owen, Alan E. et al., "Electronic Conduction and Switching in Chalcogenide Glasses," IEEE Transactions on Electron Devices, vol. Ed. 20, No. 2, Feb. 1973, pp. 105-122.

Pellizer, F. et al.,"Novel u Trench Phase-Change Memory Cell for Embedded and Stand-Alone Non-Volatile Memory Applications," 2004 Symposium on VLSI Technology Digest of Technical Papers, pp. 18-19.

Pirovano, Agostino et al.,"Reliability Study of Phase-Change Non-volatile Memories," IEEE Transactions on Device and Materials Reliability, Sep. 2004, pp. 422-427, vol. 4, No. 3.

Prakash, S. et al., "A guideline for Designing Chalcogenide-Based Glasses for Threshold Switching Characteristics," IEEE Electron Device Letters, vol. 18, No. 2, Feb. 1997, pp. 45-47.

Radaelli, A. et al., "Electronic Switching Effect and Phase-Change Transition in Chalcogenide Materials," IEEE Electron Device Letters, Oct. 2004, pp. 684-686, vol. 25, No. 10.

Rochefort, C. et al., "Manufacturing of High Aspect-Ration p-n Junctions Using Vapor Phase Doping for Application in Multi-Resurf Devices," IEEE 2002, pp. 237-240.

Schafft, Harry A. et al., "Thermal Conductivity Measurements of Thin Films Silicon Dioxide," Proceedings of the IEEE 1989 International Conference on Microelectronic Test Structures vol. 2, No. 1, Mar. 1989, pp. 121-124.

Strauss, Karl F. et al., "Overview of Radiation Tolerant Unlimited Write Cycle Non-Volatile Memory," IEEE 2000, pp. 399-408.

Subramanian, Vivek et al., "Low Leakage Germanium-Seeded Laterally-Crystallized Single-Grain 100-nm TFT's for Vertical Integration Applications," IEEE Electron Device Letters, vol. 20, No. 7, Jul. 1999, pp. 341-343.

Wicker, Guy et al., Nonvolatile, High Density, High Performance Phase Change Memory, 1999, http://klabs.org/richcontent/MAPLDCon99/Papers/P21_Tyson_P.PDF#search='nonvolatile%20high%20density%20high%20performance%20phase%20change%20memory', 8pages.

Wicker, Guy, "A Comprehensive Model of Submicron Chalcogenide Switching Devices," Doctoral Dissertation, Wayne State University, Detroit, MI 1996, 137 pp.

Wolf, Stanley, Excerpt from: Silicon Processing for the VLSI Era-vol. 4, pp. 674-679, 2004.

Wuttig, Matthias, "Towards a Universal Memory?" Nature Materials, Apr. 2005, pp. 265-266, vol. 4.

Yi, J. H. et al., "Novel Cell Structure of PRAM with Thin Metal Layer Inserted GeSbTe," IEEE IEDM 2003, 4 pages.

Yonehara, T. et al., "Control of Grain Boundary Location by Selective Nucleation Over Amorphous Substrates," Mat. Res. Soc. Symp. Proc., vol. 106, 1998, pp. 21-26.

* cited by examiner

MEMORY CELL DEVICE WITH COPLANAR ELECTRODE SURFACE AND METHOD

CROSS-REFERENCE TO RELATED APPLICATIONS

This application is a divisional of co-pending U.S. patent application Ser. No. 12/023,978 filed on 31 Jan. 2008, which application claims the benefit of U.S. Provisional Application No. 60/887,959, filed 2 Feb. 2007, entitled Memory Cell Device with Coplanar Electrode Surface and Method, which applications are incorporated by reference herein.

PARTIES TO A JOINT RESEARCH AGREEMENT

International Business Machines Corporation, a New York corporation; Macronix International Corporation, Ltd., a Taiwan corporation, and Infineon Technologies A.G., a German corporation, are parties to a Joint Research Agreement.

BACKGROUND OF THE INVENTION

1. Field of the Invention

The present invention relates to high density memory devices based on memory materials, for example phase change memory (PCM) devices, and to methods for manufacturing such devices. The memory material is switchable between electrical property states by the application of energy. The memory materials may be phase change based memory materials, including chalcogenide based materials, and other materials.

2. Description of Related Art

Phase change based memory materials are widely used in read-write optical disks. These materials have at least two solid phases, including for example a generally amorphous solid phase and a generally crystalline solid phase. Laser pulses are used in read-write optical disks to switch between phases and to read the optical properties of the material after the phase change.

Phase change based memory materials, like chalcogenide based materials and similar materials, also can be caused to change phase by application of electrical current at levels suitable for implementation in integrated circuits. The generally amorphous state is characterized by higher resistivity than the generally crystalline state; this difference in resistance can be readily sensed to indicate data. These properties have generated interest in using programmable resistive material to form nonvolatile memory circuits, which can be read and written with random access.

The change from the amorphous to the crystalline state is generally a lower current operation. The change from crystalline to amorphous, referred to as reset herein, is generally a higher current operation, which includes a short high current density pulse to melt or breakdown the crystalline structure, after which the phase change material cools quickly, quenching the phase change process, allowing at least a portion of the phase change structure to stabilize in the amorphous state. It is desirable to minimize the magnitude of the reset current used to cause transition of phase change material from crystalline state to amorphous state. The magnitude of the reset current needed for reset can be reduced by reducing the size of the phase change material element in the cell and by reducing the size of the contact area between electrodes and the phase change material, so that higher current densities are achieved with small absolute current values through the phase change material element.

One direction of development has been toward using small quantities of programmable resistive material, particularly in small pores. Patents illustrating development toward small pores include: Ovshinsky, "Multibit Single Cell Memory Element Having Tapered Contact," U.S. Pat. No. 5,687,112, issued Nov. 11, 1997; Zahorik et al., "Method of Making Chalogenide [sic] Memory Device," U.S. Pat. No. 5,789,277, issued Aug. 4, 1998; Doan et al., "Controllable Ovonic Phase-Change Semiconductor Memory Device and Methods of Fabricating the Same," U.S. Pat. No. 6,150,253, issued Nov. 21, 2000.

In phase change memory, data is stored by causing transitions in the phase change material between amorphous and crystalline states using current. Current heats the material and causes transitions between the states. The change from the amorphous to the crystalline state is generally a lower current operation. The change from crystalline to amorphous, referred to as reset herein, is generally a higher current operation. It is desirable to minimize the magnitude of the reset current used to cause transition of phase change material from crystalline state to amorphous state. The magnitude of the reset current needed for reset can be reduced by reducing the size of the active phase change material element in the cell.

One problem associated with phase change memory devices arises because the magnitude of the current required for reset operations depends on the volume of phase change material that must change phase. Thus, cells made using standard integrated circuit manufacturing processes have been limited by the minimum feature size of manufacturing equipment. Thus, techniques to provide sublithographic dimensions for the memory cells must be developed, which can lack uniformity or reliability needed for large scale, high density memory devices.

One approach to controlling the size of the active area in a phase change cell is to devise very small electrodes for delivering current to a body of phase change material. This small electrode structure induces phase change in the phase change material in a small area like the head of a mushroom, at the location of the contact. See, U.S. Pat. No. 6,429,064, issued Aug. 6, 2002, to Wicker, "Reduced Contact Areas of Sidewall Conductor;" U.S. Pat. No. 6,462,353, issued Oct. 8, 2002, to Gilgen, "Method for Fabricating a Small Area of Contact Between Electrodes;" U.S. Pat. No. 6,501,111, issued Dec. 31, 2002, to Lowrey, "Three-Dimensional (3D) Programmable Device;" U.S. Pat. No. 6,563,156, issued Jul. 1, 2003, to Harshfield, "Memory Elements and Methods for Making Same."

Accordingly, an opportunity arises to devise methods and structures that form memory cells with structures that have small active regions of programmable resistive material using reliable and repeatable manufacturing techniques.

BRIEF SUMMARY OF THE INVENTION

A memory device described herein includes a bit line having a top surface and a plurality of vias. The device includes a plurality of first electrodes each having top surfaces coplanar with the top surface of the bit line, the first electrodes extending through corresponding vias in the bit line. An insulating member is within each via and has an annular shape with a thickness between the corresponding first electrode and a portion of the bit line acting as a second electrode. A layer of memory material extends across the insulating members to contact the top surfaces of the bit line and the first electrodes.

A method for manufacturing a memory device described herein includes providing access circuitry for a plurality of memory cells, the access circuitry having a top surface with an array of conductive contacts. A plurality of first electrodes are formed on the top surface of the access circuitry, wherein first electrodes in the plurality of first electrodes contact corresponding conductive contacts. A conformal layer of dielectric material is formed on the first electrodes and the top surface of the access circuitry. A layer of conductive material is formed on the layer of dielectric material. The layer of dielectric material and the layer of conductive material are planarized to expose top surfaces of the first electrodes, the top surfaces of the first electrodes coplanar with a top surface of the layer of conductive material. The planarizing forms a plurality of vias in the layer conductive material and a plurality of insulating members from the layer of dielectric material. The first electrodes extend through corresponding vias in the layer of conductive material, and insulating members within corresponding vias have an annular shape with a thickness between the corresponding first electrode and the layer of conductive material. A layer of memory material is formed on the top surface of the layer of conductive material, the insulating members, and the top surfaces of the first electrodes. The layer of conductive material and the layer of memory material are then patterned to form a plurality of bit lines comprising conductive material and a plurality of strips of memory material, each strip of memory material overlying a corresponding bit line.

A method for manufacturing a memory device described herein includes providing access circuitry for a plurality of memory cells, the access circuitry having a top surface with an array of conductive contacts. A first dielectric material layer is formed on the top surface of the access circuitry, and a layer of conductive material is formed on the first dielectric material layer. A plurality of vias are formed in the layer of conductive material and the first dielectric material layer, thereby exposing top surfaces of the conductive contacts. A second dielectric material layer is formed on the layer of conductive material and within the plurality of vias, the second dielectric material layer defining first openings within the vias. Anisotropic etching is then performed on the second dielectric material layer to form a plurality of insulating members, the insulating members within corresponding vias and defining second openings extending to the top surfaces of corresponding conductive contacts. First electrodes are then formed within the second openings, the first electrodes having respective top surfaces coplanar with a top surface of the layer of conductive material. A layer of memory material is formed on the top surface of the layer of conductive material and the top surfaces of the first electrodes. The layer of conductive material and the layer of memory material are then patterned to form a plurality of bit lines comprising conductive material and a plurality of strips of memory material, each strip of memory material overlying a corresponding bit line.

A memory cell as described herein results in an active region of the memory element that can be made extremely small, thereby reducing the amount of current needed to induce a phase change. The thickness of the memory material of memory element can be established using a thin film deposition technique of memory material on the top surfaces of the first and second electrodes. Furthermore, the first electrode has a width (which in some embodiments is a diameter) that is preferably less than a minimum feature size for a process, typically a lithographic process, used to form the memory cell. The small first electrode concentrates current density in the portion of the memory element adjacent the first electrode, thereby reducing the magnitude of the current needed to induce a phase change and resulting in the active region having a "mushroom" shape. Additionally, the insulating member provides thermal isolation to the active region which also helps to reduce the amount of current necessary to induce a phase change.

Other features, aspects and advantages of the present invention can be seen on review of the figures, the detailed description, and the claims which follow.

DETAILED DESCRIPTION OF THE INVENTION

Figure 1:
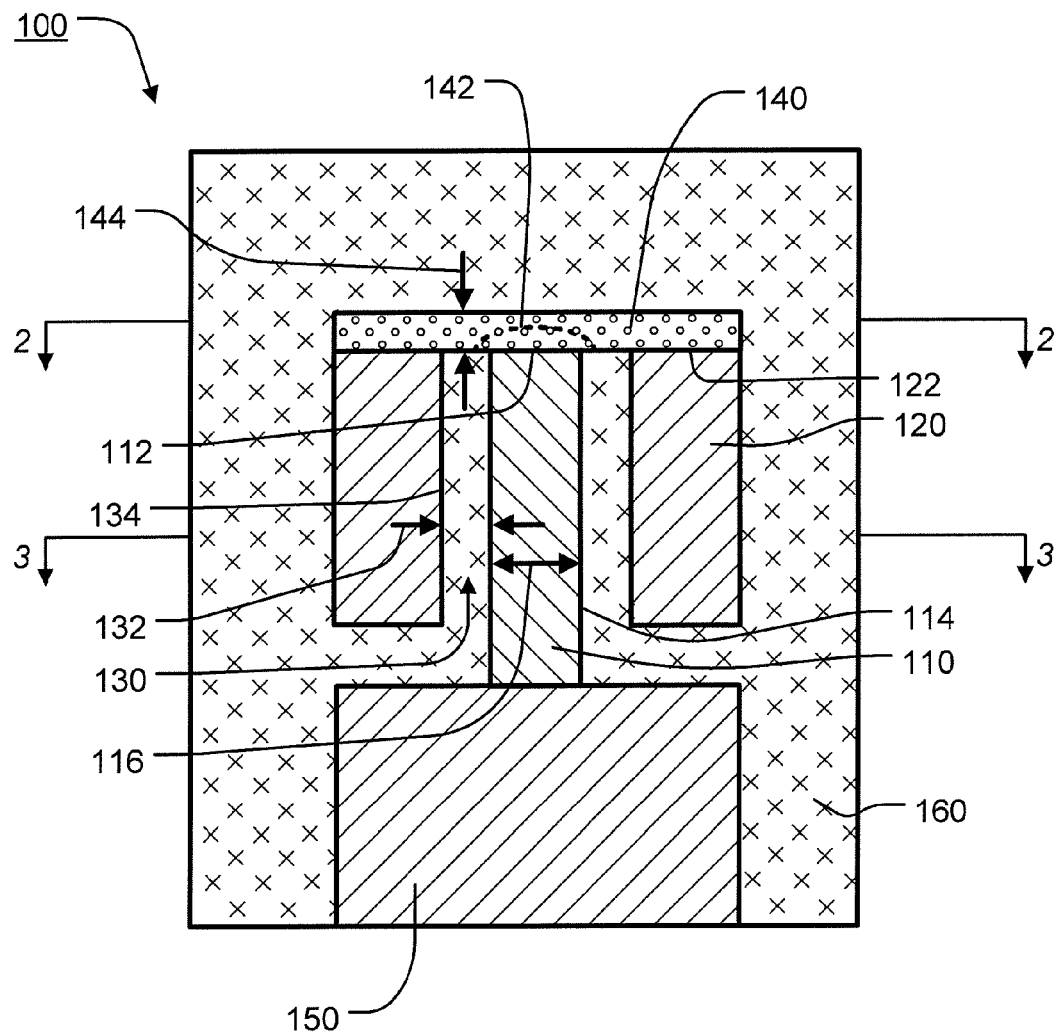
FIG. 1 illustrates a cross-sectional view of a memory cell having a first electrode and a second electrode having coplanar top surfaces.

The following description of the invention will typically be with reference to specific structural embodiments and methods. It is to be understood that there is no intention to limit the invention to the specifically disclosed embodiments and methods but that the invention may be practiced using other features, elements, methods and embodiments. Preferred embodiments are described to illustrate the present invention, not to limit its scope, which is defined by the claims. Those of ordinary skill in the art will recognize a variety of equivalent variations on the description that follows. Like elements in various embodiments are commonly referred to with like reference numerals.

Figure 2:
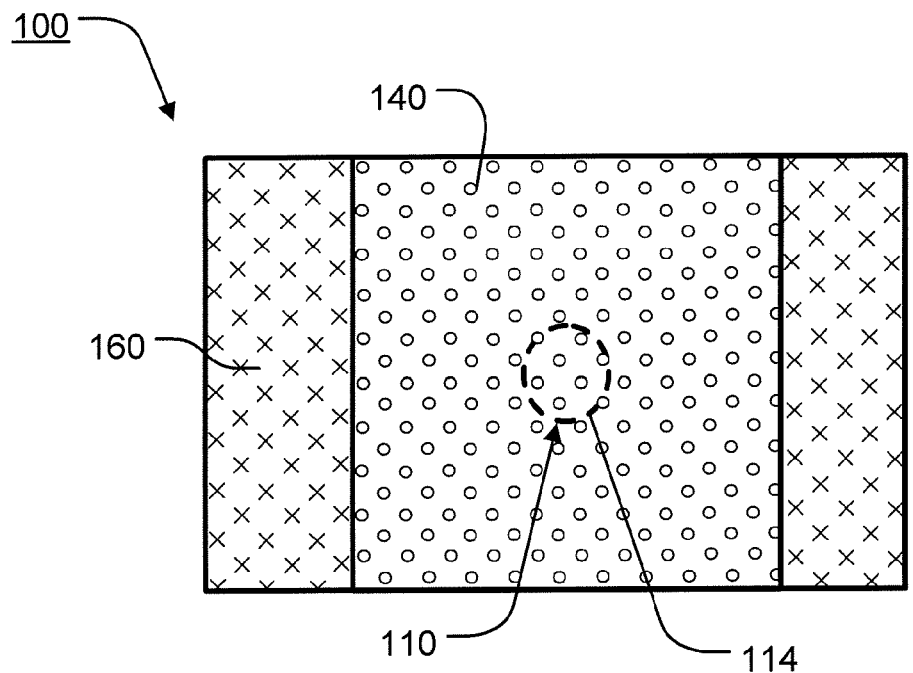
FIGS. 2-3 are top views of the memory cell of FIG. 1.
Figure 3:
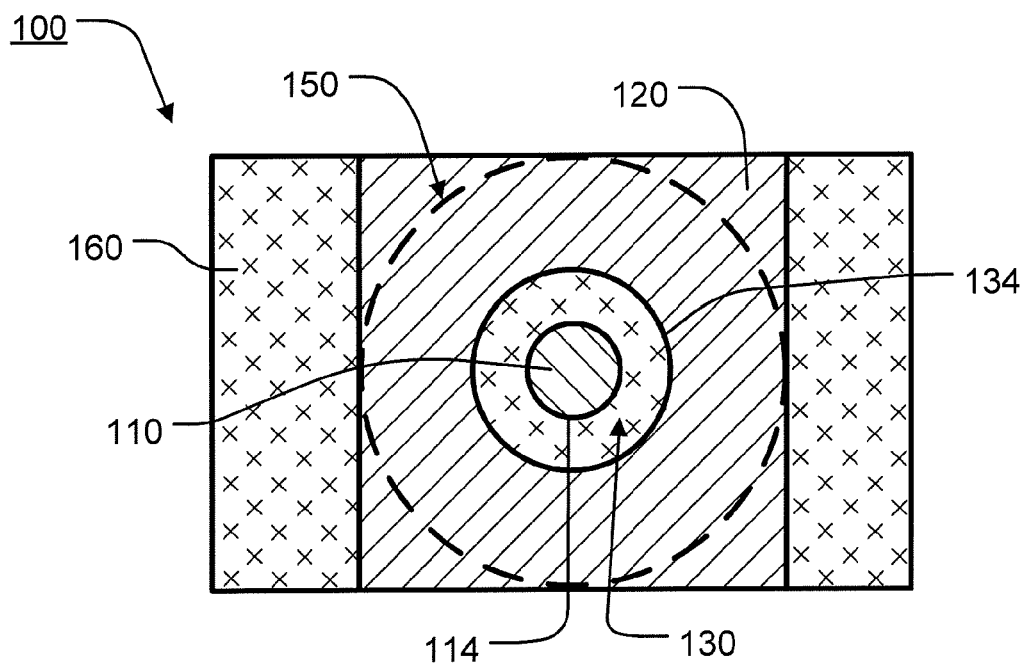

FIG. 1 illustrates a cross-sectional view of a memory cell 100 having a first electrode 110 and a bit line 120 acting as a second electrode, the first electrode 110 and the bit line 120 having coplanar top surfaces 112 and 122 respectively. FIGS. 2 and 3 are top views of the memory cell 100 of FIG. 1 taken along lines 2-2 and 3-3 respectively.

Referring to FIGS. 1-3, a dielectric insulating member 130 is within a via in the bit line 120 and has an annular shape with a thickness 132 between an outer surface 114 of the first electrode 110 and an inner surface 134 of the via in the bit line 120. A layer of memory material 140 extends across the insulating member 130 to contact the top surfaces 112, 122 of the first electrode 110 and bit line 120. The layer of memory material 140 may comprise one or more materials from a group consisting of Ge, Sb, Te, Se, In, Ti, Ga, Bi, Sn, Cu, Pd, Pb, Ag, S, Si, O, P, As, N and Au.

The first electrode 110 extends through the via in the bit line 120 to couple the layer of memory material 140 to a conductive plug 150. The first electrode 110 may comprise, for example, TiN or TaN. TiN may be preferred in embodiments in which the layer of memory material 140 comprises GST (discussed below) because it makes good contact with GST, it is a common material used in semiconductor manufacturing, and it provides a good diffusion barrier at higher temperatures at which GST transitions, typically in the 600-700° C. range. Alternatively, the first electrode 110 may be TiAlN or TaAlN, or comprises, for further examples, one or more elements selected from the group consisting of Ti, W, Mo, Al, Ta, Cu, Pt, Ir, La, Ni, N, O and Ru and combinations thereof.

The conductive plug 150 extends through inter-layer dielectric 160 to underlying access circuitry (not shown), the plug 150 preferably comprising a refractory metal such as tungsten. Other metals that could be used include Ti, Mo, Al, Ta, Cu, Pt, Ir, La, Ni, and Ru. Other plug structures and materials can be used as well.

The inter-layer dielectric 160 including the insulating member 130 may comprise one or more layers of dielectric material, for example each layer comprising one or more elements selected from the group consisting of Si, Ti, Al, Ta, N, O, and C. It is preferred that the insulating member 130 comprises a low thermal conductivity material such as being less than about 0.014 J/cm*K*sec. In some preferred embodiments the insulating member 130 has a thermal conductivity less than that of the amorphous state of the phase change material of the layer of memory material 140, or less than about 0.003 J/cm*K*sec for a phase change material comprising GST. Representative thermally insulating materials include materials that are a combination of the elements of silicon Si, carbon C, oxygen O, fluorine F, and hydrogen H. Examples of thermally insulating materials which are candidates for use for insulating member 130 include $SiO_2$, $SiN_x$, SiCOH, polymide, polyamide, and flourocarbon polymers.

The bit line 120 may comprise, for example, any of the materials discussed above with reference to the first electrode 110.

In operation, voltages on the plug 150 and bit line 120 can induce a current to flow from the plug 150 to the bit line 120, or vice versa, via the first electrode 110 and the bit line 120.

The active region 142 is the region of the layer of memory material 140 in which the memory material is induced to change between at least two solid phases. As can be appreciated the active region 142 can be made extremely small in the illustrated structure, thus reducing the magnitude of current needed to induce a phase change. The thickness 144 of the layer of memory material 140 can be established using a thin film deposition technique of memory material on the top surfaces 112, 122 of the first electrode 110 and bit line 120. In some embodiments the thickness 144 is less than or equal to about 100 nm, for example being between 1 and 100 nm. Furthermore, the first electrode 110 has a width 116 (which is a diameter in the illustrated embodiment) which is preferably less than a minimum feature size for a process, typically a lithographic process, used to form the memory cell 100. The small first electrode 110 concentrates current density in the portion of the layer of memory material 140 adjacent the first electrode 110, thereby reducing the magnitude of the current needed to induce a phase change and resulting in the active region 142 having a "mushroom" shape as shown in FIG. 1. The width 116 of the first electrode 110 can be less than 65 nm, for example being between about 10 nm and 50 nm. Additionally, dielectric 160 including the insulating member 130 provides thermal isolation to the active region 142 which also helps to reduce the amount of current necessary to induce a phase change.

The coplanar top surfaces 112, 122 will cause the current flow path from the first electrode 110 to turn laterally into the second bit line 120, thereby concentrating the current density in the portion of the layer of memory material 140 adjacent the first electrode 110 and reducing the magnitude of the current needed to induce a phase change in the active region 142.

Embodiments of memory cell 100 include phase change based memory materials, including chalcogenide based materials and other materials, for the layer of memory material 140. Chalcogens include any of the four elements oxygen (O), sulfur (S), selenium (Se), and tellurium (Te), forming part of group VIA of the periodic table. Chalcogenides comprise compounds of a chalcogen with a more electropositive element or radical. Chalcogenide alloys comprise combinations of chalcogenides with other materials such as transition metals. A chalcogenide alloy usually contains one or more elements from group IVA of the periodic table of elements, such as germanium (Ge) and tin (Sn). Often, chalcogenide alloys include combinations including one or more of antimony (Sb), gallium (Ga), indium (In), and silver (Ag). Many phase change based memory materials have been described in technical literature, including alloys of: Ga/Sb, In/Sb, In/Se, Sb/Te, Ge/Te, Ge/Sb/Te, In/Sb/Te, Ga/Se/Te, Sn/Sb/Te, In/Sb/Ge, Ag/In/Sb/Te, Ge/Sn/Sb/Te, Ge/Sb/Se/Te and Te/Ge/Sb/S. In the family of Ge/Sb/Te alloys, a wide range of alloy compositions may be workable. The compositions can be characterized as $Te_aGe_bSb_{100-(a+b)}$, where a and b represent atomic percentages that total 100% of the atoms of the constituent elements. One researcher has described the most useful alloys as having an average concentration of Te in the deposited materials well below 70%, typically below about 60% and ranged in general from as low as about 23% up to about 58% Te and most preferably about 48% to 58% Te. Concentrations of Ge were above about 5% and ranged from a low of about 8% to about 30% average in the material, remaining generally below 50%. Most preferably, concentrations of Ge ranged from about 8% to about 40%. The remainder of the principal constituent elements in this composition was Sb. (Ovshinsky '112 patent, cols 10-11.) Particular alloys evaluated by another researcher include $Ge_2Sb_2Te_5$, $GeSb_2Te_4$ and $GeSb_4Te_7$. (Noboru Yamada, "Potential of Ge—Sb—Te Phase-Change Optical Disks for High-Data-Rate Recording", SPIE v.3109, pp. 28-37 (1997).) More generally, a transition metal such as chromium (Cr), iron (Fe), nickel (Ni), niobium (Nb), palladium (Pd), platinum (Pt) and mixtures or alloys thereof may be combined with Ge/Sb/Te to form a phase change alloy that has programmable resistive properties. Specific examples of memory materials that may be useful are given in Ovshinsky '112 at columns 11-13, which examples are hereby incorporated by reference.

Chalcogenides and other phase change materials are doped with impurities in some embodiments to modify conductivity, transition temperature, melting temperature, and other properties of memory elements using the doped chalcogenides. Representative impurities used for doping chalcogenides include nitrogen, silicon, oxygen, silicon dioxide, silicon nitride, copper, silver, gold, aluminum, aluminum oxide, tantalum, tantalum oxide, tantalum nitride, titanium and titanium oxide. See, e.g. U.S. Pat. No. 6,800,504, and U.S. Patent Application Publication No. US 2005/0029502.

Phase change materials can be changed from one phase state to another by application of electrical pulses. It has been observed that a shorter, higher amplitude pulse tends to change the phase change material to a generally amorphous state, and is referred to as a reset pulse. A longer, lower amplitude pulse tends to change the phase change material to a generally crystalline state, and is referred to as a program pulse. The energy in a shorter, higher amplitude pulse is high enough to allow for bonds of the crystalline structure to be broken and short enough to prevent the atoms from realigning into a crystalline state. Appropriate profiles for pulses can be determined empirically, without undue experimentation, specifically adapted to a particular phase change material and device structure.

Representative chalcogenide material can be characterized as follows: $Ge_xSb_yTe_z$, where x:y:z=2:2:5. Other compositions can be used with x: 0~5; y: 0~5; z: 0~10. GeSbTe with doping, such as N-, Si-, Ti-, or other element doping, may also be used. These materials can be formed by PVD sputtering or magnetron-sputtering with reactive gases of Ar, N2, and/or He, etc. and chalcogenide at the pressure of 1 mtorr~100 mtorr. The deposition is usually done at room temperature. A collimator with an aspect ratio of 1~5 can be used to improve the fill-in performance. To improve the fill-in performance, the DC bias of several tens of volts to several hundreds of volts is also used. Also, the combination of DC bias and the collimator can be used simultaneously. The post deposition annealing treatment with vacuum or N2 ambient is sometimes needed to improve the crystallized state of chalcogenide material. The annealing temperature typically ranges 100° C. to 400° C. with an anneal time of less than 30 minutes.

FIGS. 4-10 illustrate steps in a fabrication sequence for manufacturing memory cells described herein.

Figure 4:
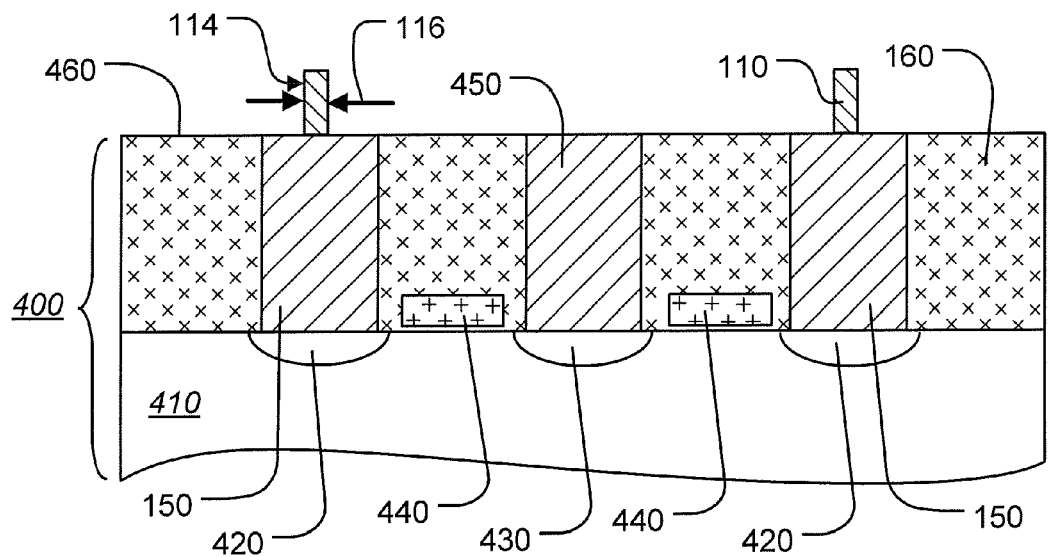
FIGS. 4-10 illustrate steps in a fabrication sequence for manufacturing memory cells described herein.

FIG. 4 illustrates a cross-sectional view of a structure formed as a first stage of the fabrication sequence, the structure including an array of first electrodes 110 contacting respective plugs 150 in a memory cell access layer 400 having a top surface 460. The memory access layer 400 can be formed by standard processes as known in the art and includes word lines 440 extending in parallel in a direction into and out of the cross section illustrated in FIG. 4. The word lines 440 overly a substrate 410 and form the gates of access transistors. Access layer 400 also includes a common source line 450 contacting doped region 430 acting as the source regions of the access transistors. In other embodiments the common source line 450 may be implemented by a doped region in the substrate 410. The plugs 150 contact corresponding doped regions 420 in the substrate 410 acting as drain regions for the access transistors.

The first electrodes 110 have an outer surface 114 and have a diameter 116 which is preferably less than a minimum feature size for a process, generally a lithographic process, used to manufacture the memory access layer 400.

The first electrodes 110 having a sublithographic diameter 116 can be formed, for example, using methods, materials, and processes as disclosed in U.S. patent application Ser. No. 11/764,678 filed on 18 Jun. 2007 entitled "Method for Manufacturing a Phase Change Memory Device with Pillar Bottom Electrode", which is incorporated by reference herein. For example, a layer of electrode material can be formed on the top surface 460 of the access layer 400, followed by patterning of a layer of photoresist on the electrode layer using standard photo lithographic techniques so as to form a mask of photoresist overlying the locations of the first electrodes 110. Next the mask of photoresist is trimmed, using for example oxygen plasma, to form mask structures having sublithographic dimensions overlying the locations of the bottom electrodes 110. Then the layer of electrode material is etched using the trimmed mask of photoresist, thereby forming the first electrodes 110 having sublithographic diameters 116.

Figure 5:
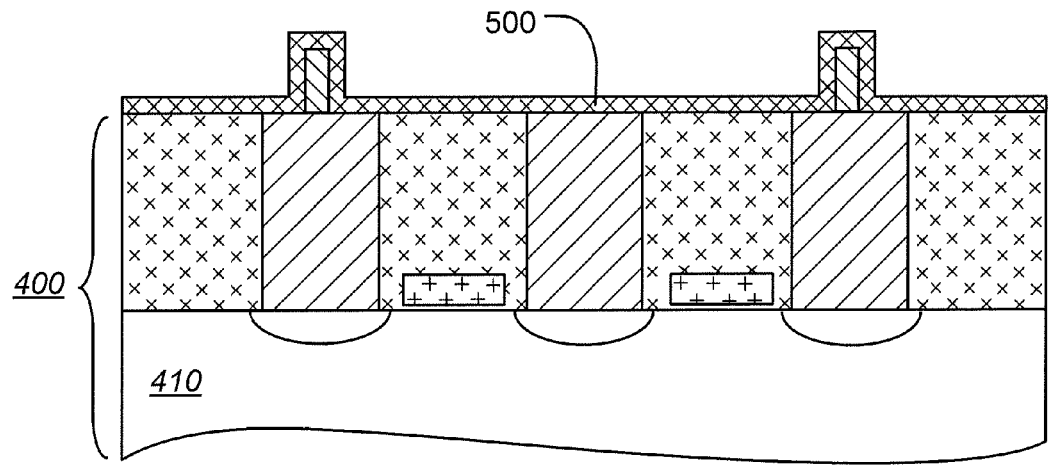

Next, a conformal dielectric material layer 500 is formed on the structure illustrated in FIG. 4, resulting in the structure illustrated in FIG. 5. Layer 500 can be formed by chemical vapor deposition CVD of dielectric material, the layer 500 comprising for example any of the materials discussed above with reference to the insulating member 130 of FIGS. 1-3.

Figure 6:
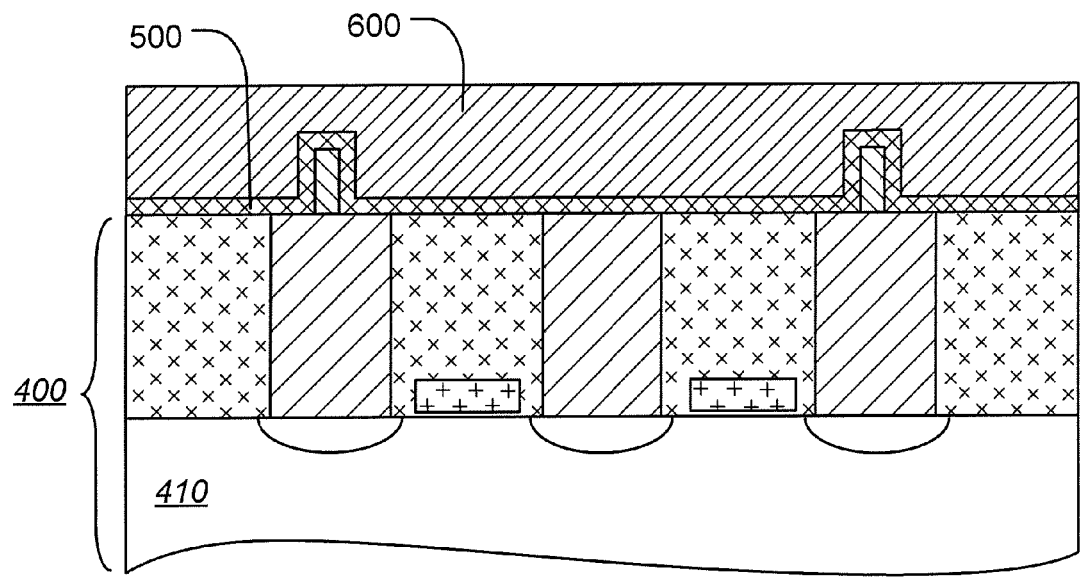

Next, a conductive material layer 600 is formed on the structure illustrated in FIG. 5, resulting in the structure illustrated in FIG. 6. The layer 600 can comprise, for example, any of the materials discussed above with reference to the second electrode 120 of FIGS. 1-3.

Figure 7:
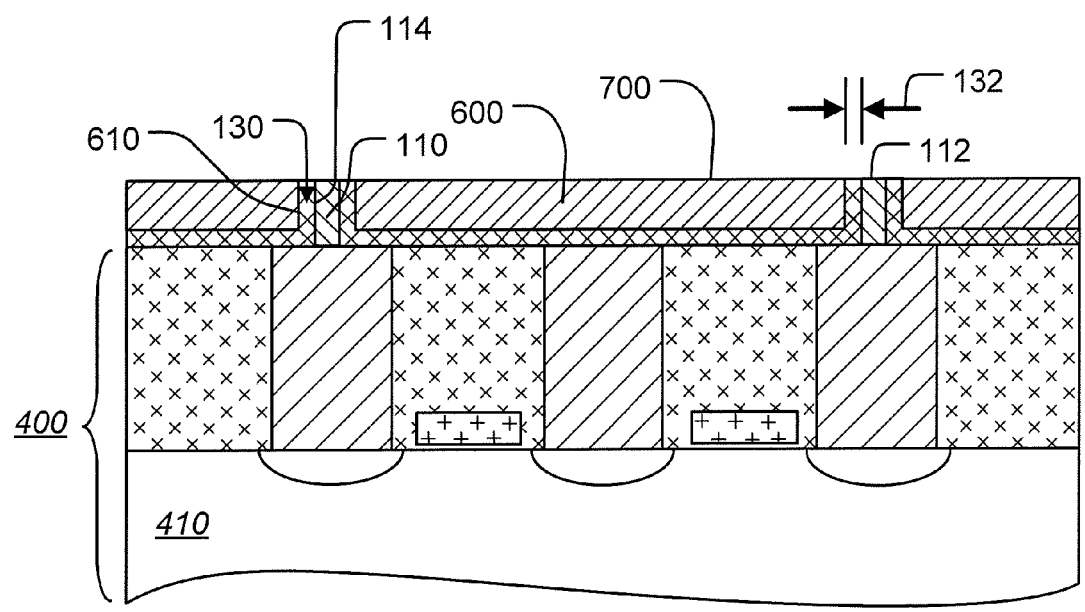

The dielectric material layer 500 and the conductive material layer 600 are then planarized to expose top surfaces 112 of the first electrodes 110, resulting in the structure illustrated in FIG. 7 having a top surface 700 of the conductive layer 600 coplanar with the top surfaces 112 of the first electrodes 110. As can be seen in the Figure, vias having inner surfaces 610 are formed in the conductive material layer 600 and insulating members 130 are formed from the dielectric material layer 500. The first electrodes 110 extend through corresponding vias in the conductive material layer 600, and insulating members 130 within the vias have an annular shape with a thickness 132 between the corresponding first electrodes 110 and the conductive material layer 600.

Figure 8:
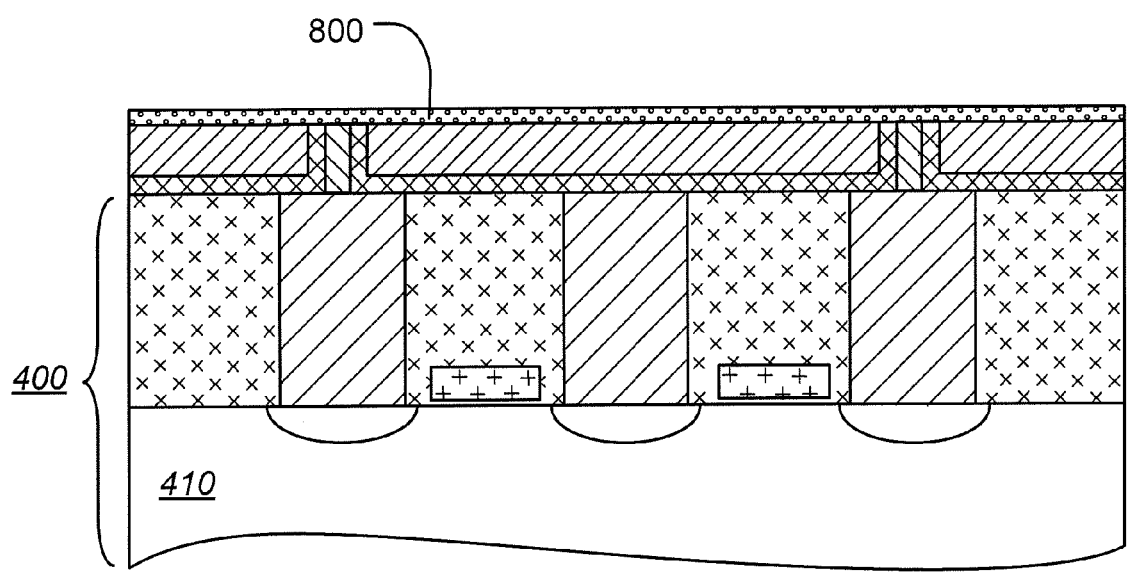

Next, a memory material layer 800 is formed on the structure illustrated in FIG. 7, resulting in the structure illustrated in FIG. 8.

Figure 9A:
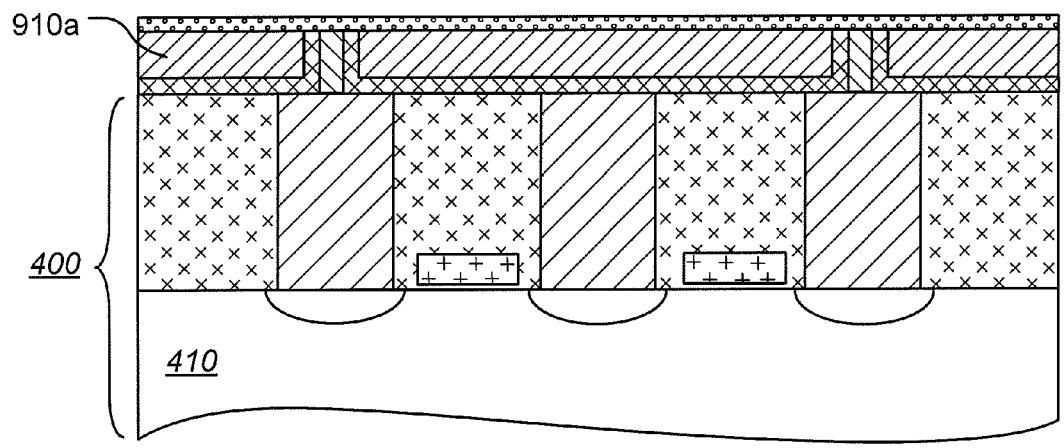
Figure 9B:
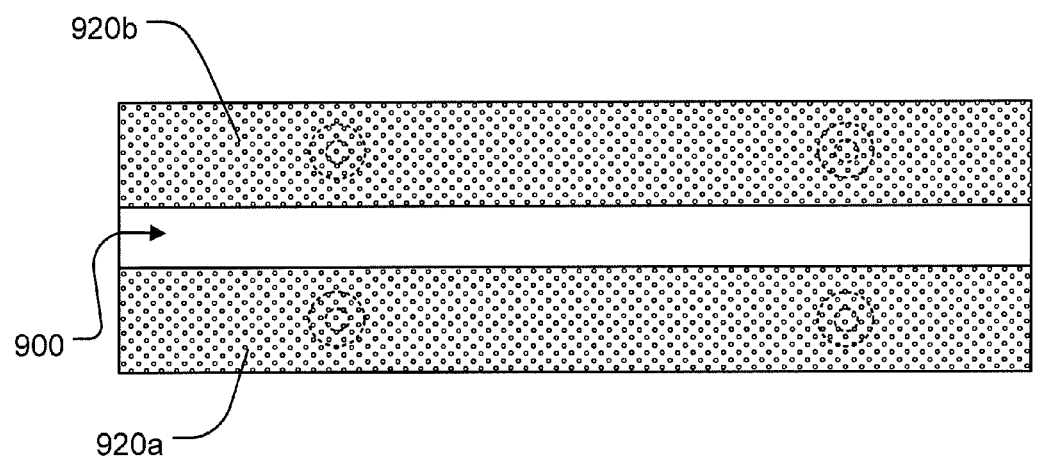

Next, the conductive layer 600 and the memory material layer 800 are patterned to form bit lines 910 separated by a trench 900 and strips of memory material 920, resulting in the structure illustrated in cross-sectional and top views of FIGS. 9A and 9B respectively. Each strip of memory material 920 overlies a corresponding bit line 910.

The bit lines 910 and strips of memory material 920 can be formed by forming a protective dielectric layer (not shown) on the memory material layer 800, patterning a layer of photoresist on the protective dielectric layer, etching the protective dielectric layer, the memory material layer 800 and the conductive layer 600 using the patterned photoresist as an etch mask, and then removing the layer of photoresist. The formation of the strips of memory material 920 removes memory material that is spaced away from the first electrode and thus spaced away from the active region. This results in a small active region for the memory cell that is not subject to etch damage.

Figure 10:
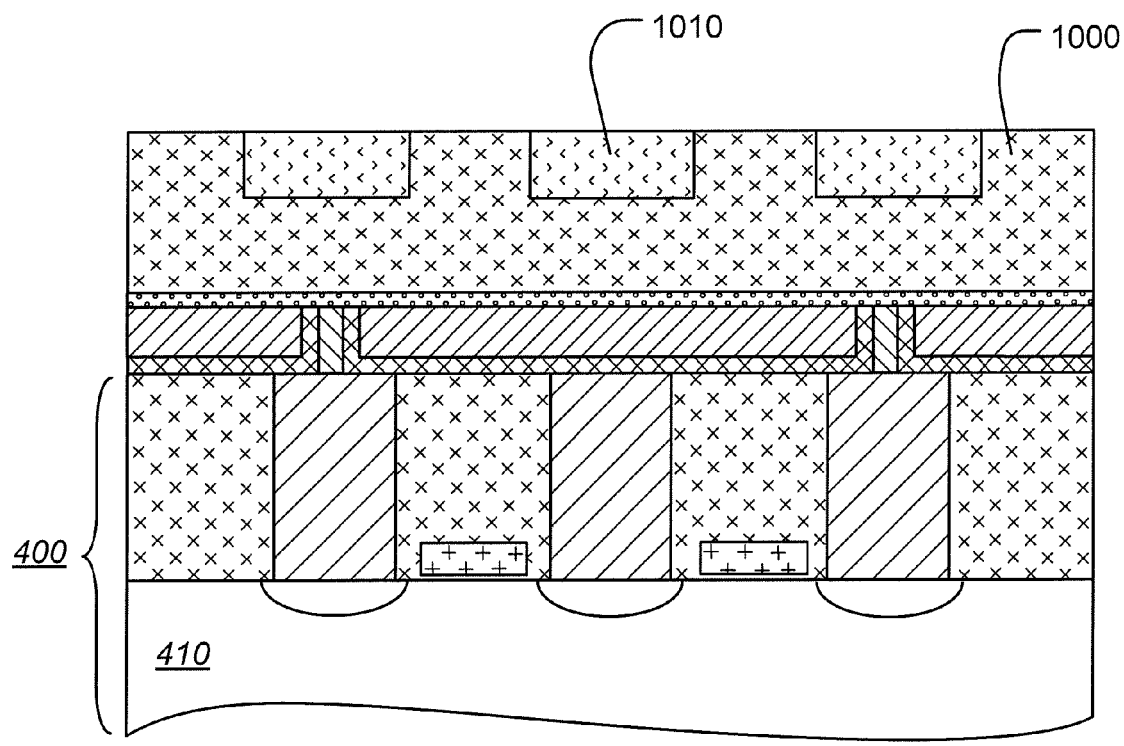

Next, standard back end of line processing as known in the art can be performed on the structure illustrated in FIGS. 9A and 9B, resulting in the structure illustrated in FIG. 10 having a dielectric layer 1000 and conductive lines 1010.

Figure 11:
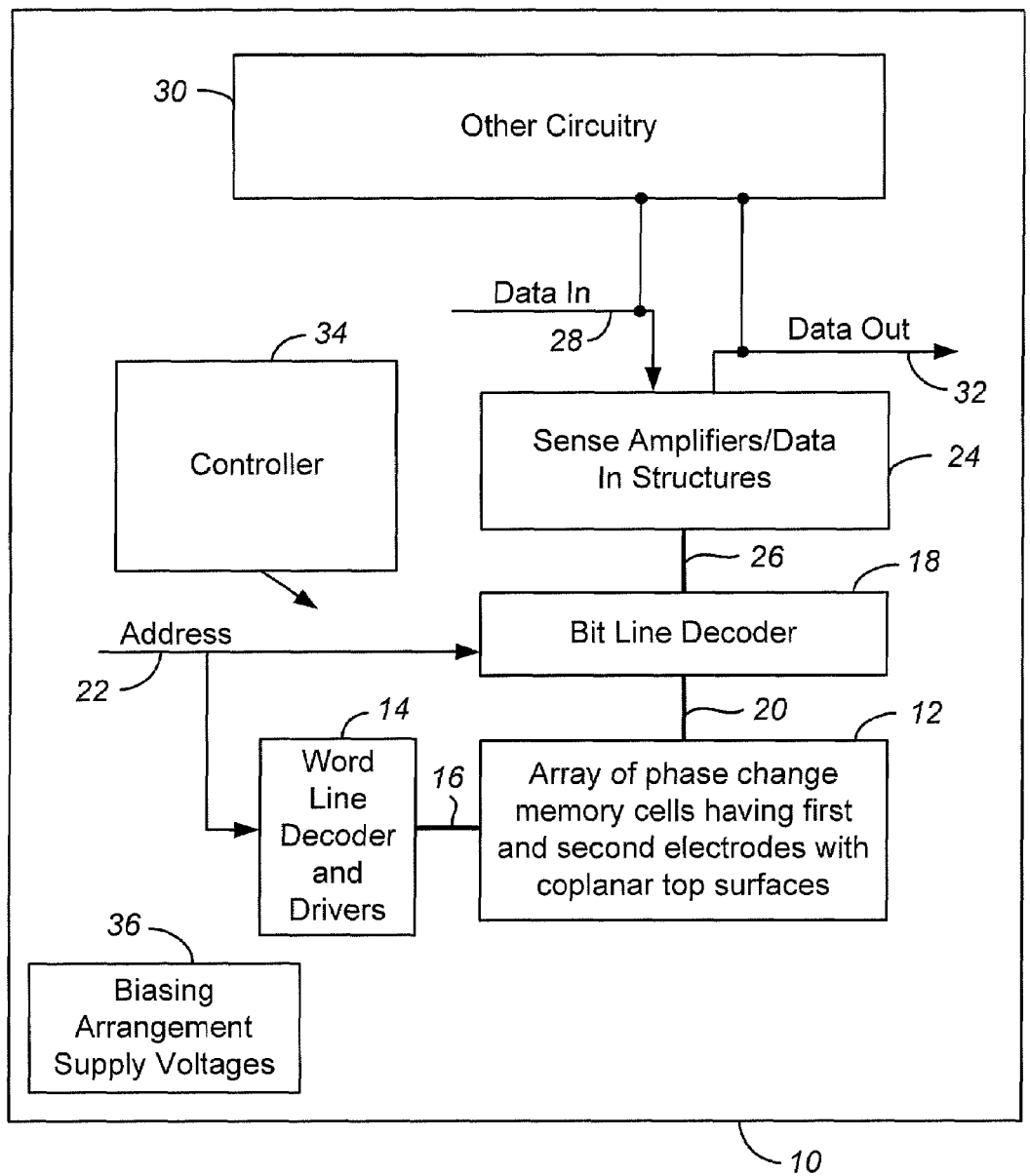
FIG. 11 is a simplified block diagram of an integrated circuit including a memory array implemented using phase change memory cells having first and second electrodes with coplanar top surfaces.

FIG. 11 is a simplified block diagram of an integrated circuit 10 including a memory array 12 implemented using phase change memory cells as described herein having first and second electrodes with coplanar top surfaces. A word line decoder 14 is coupled to, and in electrical communication with, a plurality of word lines 16. A bit line (column) decoder 18 is in electrical communication with a plurality of bit lines 20 to read data from, and write data to, the phase change memory cells in array 12. Addresses are supplied on bus 22 to word line decoder and drivers 14 and bit line decoder 18. Sense amplifiers and data-in structures in block 24 are coupled to bit line decoder 18 via data bus 26. Data is supplied via a data-in line 28 from input/output ports on integrated circuit 10, or from other data sources internal or external to integrated circuit 10, to data-in structures in block 24. Other circuitry 30 may be included on integrated circuit 10, such as a general purpose processor or special purpose application circuitry, or a combination of modules providing system-on-a-chip functionality supported by array 12. Data is supplied via a data-out line 32 from the sense amplifiers in block 24 to input/output ports on integrated circuit 10, or to other data destinations internal or external to integrated circuit 10.

A controller 34, implemented in this example using a bias arrangement state machine, controls the application of bias arrangement supply voltages 36, such as read, program, erase, erase verify and program verify voltages. Controller 34 may be implemented using special-purpose logic circuitry as known in the art. In alternative embodiments, controller 34 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 34.

Figure 12:
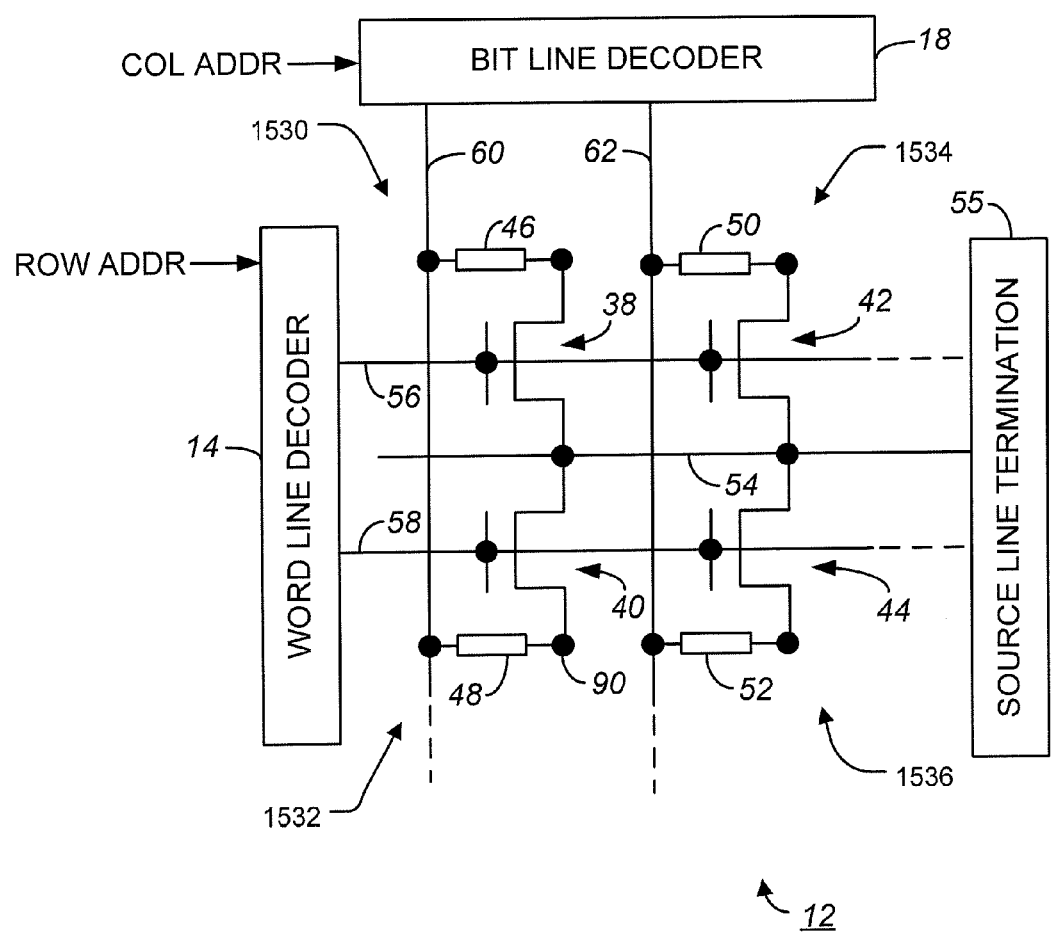
FIG. 12 is a schematic diagram of a portion of a memory array having memory cells as described herein.

As shown in FIG. 12 each of the memory cells 1530, 1532, 1534, 1536 of array 12 includes an access transistor (or other access device such as a diode), four of which are shown as 38, 40, 42 and 44, and a phase change element, shown as 46, 48, 50 and 52. Sources of each of access transistors 38, 40, 42 and 44 are connected in common to a source line 54 that terminates in a source line termination 55. In another embodiment the source lines of the access devices are not electrically connected, but independently controllable. A plurality of word lines including word lines 56 and 58 extend in parallel along a first direction. Word lines 56 and 58 are in electrical communication with word line decoder 14. The gates of access transistors 38 and 42 are connected to a common word line, such as word line 56, and the gates of access transistors 40 and 44 are connected in common to word line 58. A plurality of bit lines including bit lines 60 and 62 extend in parallel along a second direction and are connected to one end of the phase change elements, for example phase change elements 46 and 48 are connected to bit line 60. Specifically, phase change element 46 is connected between the drain of access transistor 38 and bit line 60, and phase change element 48 is connected between the drain of access transistor 40 and bit line 60. Similarly, phase change element 50 is connected between the drain of access transistor 42 and bit line 62, and phase change element 52 is connected between the drain of access transistor 44 and bit line 62. It should be noted that four memory cells are shown for convenience of discussion and in practice array 12 may comprise thousands to millions of such memory cells. Also, other array structures may be used, e.g. the phase change memory element is connected to the source of an access transistor.

FIGS. 13-18 illustrate alternative steps in a fabrication sequence to those illustrated in FIGS. 4-7 for forming the first electrodes and the insulating members.

Figure 13:
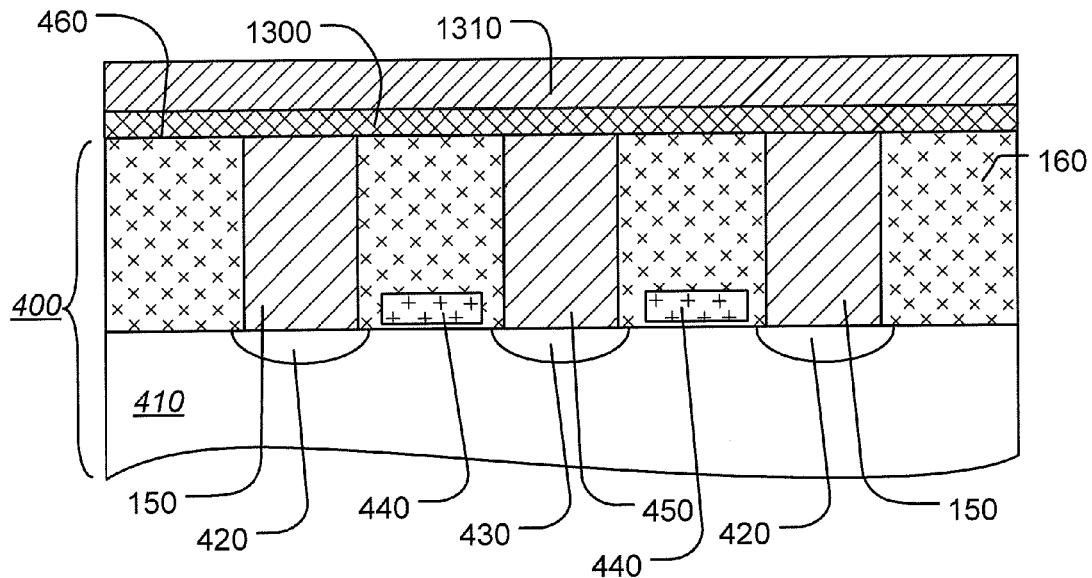
FIGS. 13-18 illustrate alternative steps in a fabrication sequence to those illustrated in FIGS. 4-7.

FIG. 13 illustrates a cross-sectional view of a structure formed as a first stage of the fabrication sequence, the structure including a dielectric layer 1300 formed on the top surface 460 of the memory access layer 400 and a conductive material layer 1310 formed on the dielectric layer 1300.

Next, vias 1400 are formed through the dielectric layer 1300 and conductive material layer 1310 to expose the conductive plugs 150 of the memory access layer 400. The vias 1400 can be formed for example, by patterning a layer of photoresist on the conductive material layer 1310 and having openings overlying the locations of the vias 1400, and then etching using the patterned layer of photoresist as an etch mask.

Figure 14:
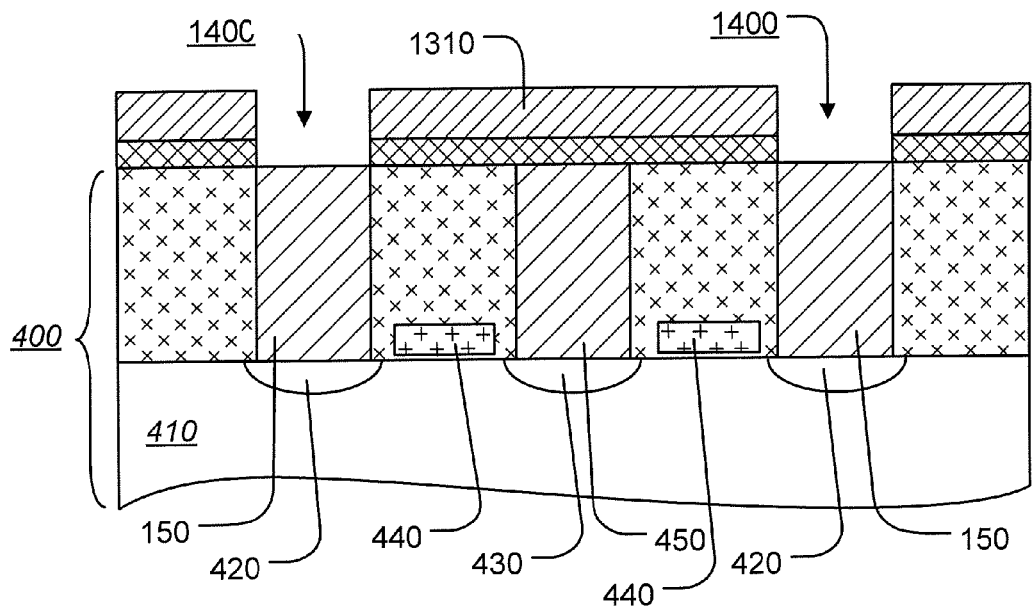
Figure 15:
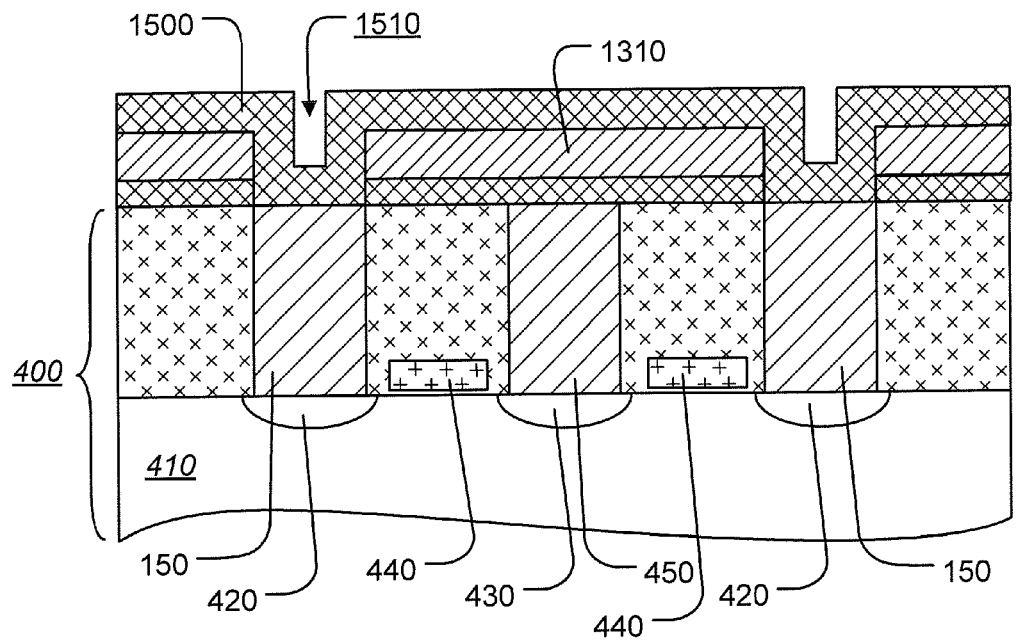

Next, a conformal dielectric material layer 1500 is formed on the structure illustrated in FIG. 14, resulting in the structure illustrated in FIG. 15. The dielectric material layer 1500 defines openings 1510 within the vias 1400 and can comprise, for example, any of the materials discussed above with reference to the insulating members 130 of FIGS. 1-3.

Figure 16:
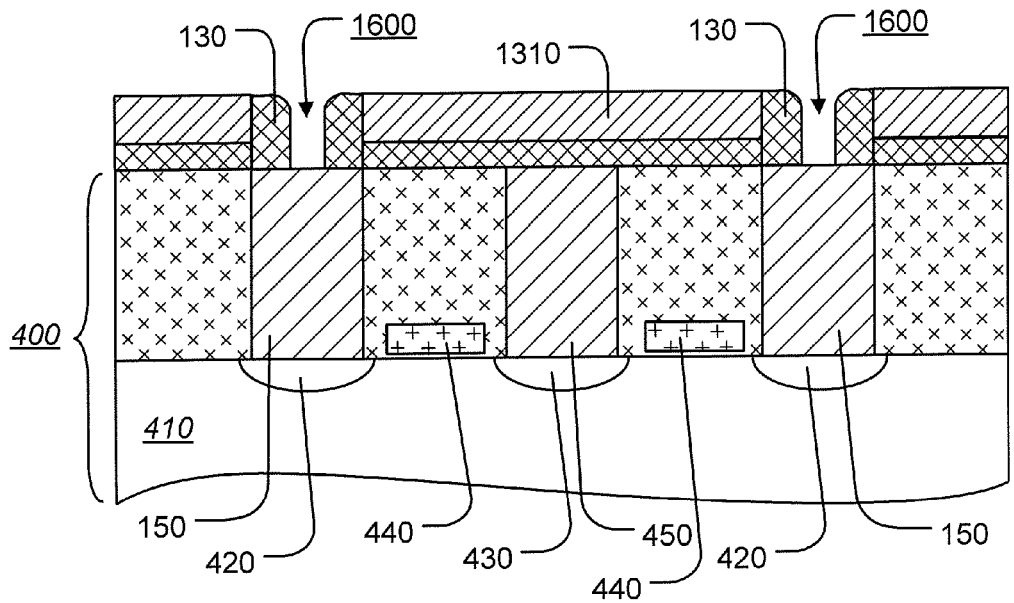

Next, anisotropic etching is performed on the dielectric material layer 1500 of FIG. 15 to expose the plugs 150 and the conductive material layer 1310, thereby forming insulating members 130 defining openings 1600, resulting in the structure illustrated in FIG. 16.

Figure 17:
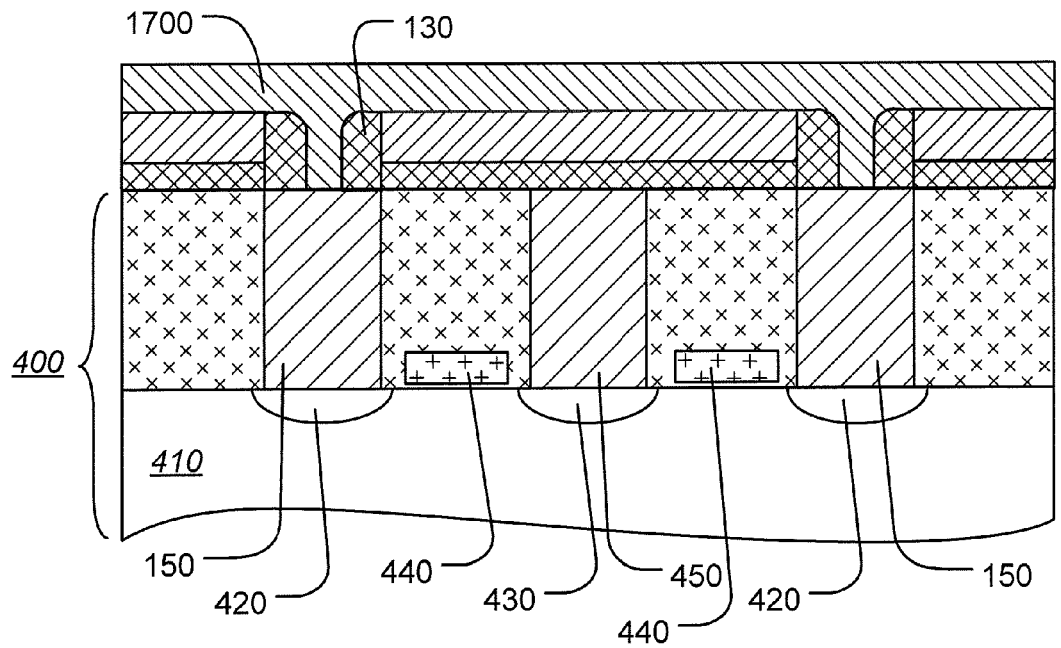
Figure 18:
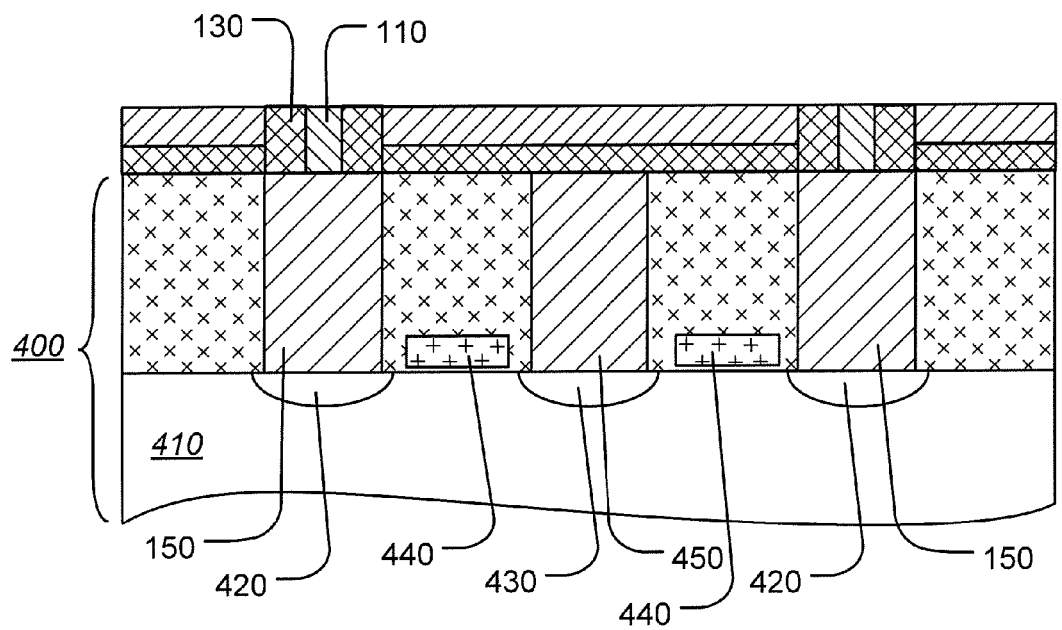

Next, a conductive material layer 1700 is formed on the structure illustrated in FIG. 16 and within openings 1600, resulting in the structure illustrated in FIG. 17. The conductive material layer 1700 may comprise, for example, any of the materials discussed above with reference to the first electrode 110 of FIGS. 1-3.

Next, a planarizing process such as Chemical Mechanical Polishing CMP is performed on the structure illustrated in FIG. 17, thereby forming first electrodes 110.

In another alternative, a dielectric layer is formed on the top surface 460 of the access circuitry 400 followed by sequentially forming a conductive material layer and a sacrificial layer. Next, a mask having openings close to or equal to the minimum feature size of the process used to create the mask is formed on the sacrificial layer, the openings overlying the conductive plugs 150. The conductive material layer and the sacrificial layer are then selectively etched using the mask, thereby forming vias in the conductive material layer and the sacrificial layer and exposing a top surface of the dielectric layer. After removal of the mask, a selective undercutting etch is performed on the vias such that the conductive material layer is etched while leaving the sacrificial layer and the dielectric layer intact. A fill material in then formed in the vias, which due to the selective undercutting etch process results in a self-aligned void in the fill material being formed within each via. Next, an anisotropic etching process is performed on the fill material to open the voids, and etching continues until the dielectric layer is exposed in the region below the void, thereby forming a sidewall spacer comprising fill material within each via. The sidewall spacers have an opening dimension substantially determined by the dimension of the void, and thus can be less than the minimum feature size of a lithographic process. Next, the dielectric layer is etched using the sidewall spacers as an etch mask, thereby forming openings in the dielectric layer having a diameter less than the minimum feature size. Next, a first electrode material layer is formed within the openings in the dielectric layer and the sidewall spacer. A planarizing process, such as chemical mechanical polishing CMP, is then performed to remove the sacrificial layer and form the first electrodes. After the planarizing process a memory material layer is formed, and then the conductive material layer and the memory material layer are patterned to form bit lines and strips of memory material overlying the bit lines.

While the present invention is disclosed by reference to the preferred embodiments and examples detailed above, it is to be understood that these examples are intended in an illustrative rather than in a limiting sense. It is contemplated that modifications and combinations will occur to those skilled in the art, which modifications and combinations will be within the spirit of the invention and the scope of the following claims.

Any and all patents, patent applications and printed publications referred to above are hereby incorporated by reference.

The invention claimed is:

1. A method for manufacturing a memory device, the method comprising:
   forming a bit line having a top surface and a plurality of vias;
   forming a plurality of first electrodes having respective top surfaces coplanar with the top surface of the bit line, the first electrodes extending through corresponding vias in the bit line;
   forming a plurality of insulating members, the insulating members within corresponding vias and having an annular shape with a thickness between the corresponding first electrode and a portion of the bit line acting as a second electrode; and forming a layer of memory material extending across the insulating members to contact the top surfaces of the bit line and the first electrodes.

2. The method of claim 1, further comprising:
forming access circuitry for a plurality of memory cells underlying the bit line, the access circuitry including an array of conductive contacts, wherein first electrodes in the plurality of first electrodes are electrically coupled to corresponding conductive contacts in the array of conductive contacts.

3. The method of claim 1, wherein the first electrodes each have a width less than a minimum feature size for a lithographic process used to form the memory device.

4. The method of claim 1, wherein the memory material comprises one or more materials from a group consisting of Ge, Sb, Te, Se, In, Ti, Ga, Bi, Sn, Cu, Pd, Pb, Ag, S, Si, O, P, As, N and Au.

5. The method of claim 1, wherein the first electrodes and the bit line each comprise an element chosen from a consisting of Ti, W, Mo, Al, Cu, Pt, Ir, La, Ni, N, O and Ru and combinations thereof.

6. The method of claim 1, wherein the layer of memory material has a thickness between about 1 nm and 100 nm.

7. A method for manufacturing a memory device, the method comprising:
providing access circuitry for a plurality of memory cells, and having a top surface with an array of conductive contacts;
forming a plurality of first electrodes on the top surface of the access circuitry, wherein first electrodes in the plurality of first electrodes contact corresponding conductive contacts;
forming a conformal layer of dielectric material on the first electrodes and the top surface of the access circuitry;
forming a layer of conductive material on the layer of dielectric material;
planarizing the layer of dielectric material and the layer of conductive material to expose top surfaces of the first electrodes, the top surfaces of the first electrodes coplanar with a top surface of the layer of conductive material, thereby forming a plurality of vias in the layer of conductive material and a plurality of insulating members from the layer of dielectric material, wherein the first electrodes extend through corresponding vias in the layer of conductive material, and insulating members within corresponding vias have an annular shape with a thickness between the corresponding first electrode and the layer of conductive material; and
forming a layer of memory material on the top surface of the layer of conductive material, the insulating members, and the top surfaces of the first electrodes; and
patterning the layer of conductive material and the layer of memory material to form a plurality of bit lines comprising conductive material and a plurality of strips of memory material, each strip of memory material overlying a corresponding bit line.

8. A method for manufacturing a memory device, the method comprising:
providing access circuitry for a plurality of memory cells, and having a top surface with an array of conductive contacts;
forming a first dielectric material layer on the top surface of the access circuitry;
forming a layer of conductive material on the first dielectric material layer;
forming a plurality of vias in the layer of conductive material and the first dielectric material layer, thereby exposing top surfaces of the conductive contacts;
forming a second dielectric material layer on the layer of conductive material and within the plurality of vias, the second dielectric material layer defining first openings within the vias;
anisotropically etching the second dielectric material layer to form a plurality of insulating members, the insulating members within corresponding vias and defining second openings extending to top surfaces of corresponding conductive contacts;
forming first electrodes within the second openings, the first electrodes having respective top surfaces coplanar with a top surface of the layer of conductive material;
forming a layer of memory material on the top surface of the layer of conductive material and the top surfaces of the first electrodes; and
patterning the layer of conductive material and the layer of memory material to form a plurality of bit lines comprising conductive material and a plurality of strips of memory material, each strip of memory material overlying a corresponding bit line.

* * * * *